(12) United States Patent
Meyer et al.

(10) Patent No.: US 12,210,049 B2
(45) Date of Patent: Jan. 28, 2025

(54) EVALUATION OF PARTIAL DISCHARGE SIGNALS

(71) Applicant: Innomotics GmbH, Nuremberg (DE)

(72) Inventors: Martin Meyer, Nuremberg (DE); Dirk Scheibner, Nuremberg (DE); Jürgen Zettner, Veitsbronn (DE)

(73) Assignee: Innomotics GmbH, Nuremberg (DE)

( * ) Notice: Subject to any disclaimer, the term of this patent is extended or adjusted under 35 U.S.C. 154(b) by 189 days.

(21) Appl. No.: 17/761,479

(22) PCT Filed: Aug. 17, 2020

(86) PCT No.: PCT/EP2020/072943
§ 371 (c)(1),
(2) Date: Mar. 17, 2022

(87) PCT Pub. No.: WO2021/052691
PCT Pub. Date: Mar. 25, 2021

(65) Prior Publication Data
US 2022/0373589 A1    Nov. 24, 2022

(30) Foreign Application Priority Data

Sep. 18, 2019 (EP) .................................... 19198066

(51) Int. Cl.
 *G01R 31/12* (2020.01)
 *G01R 31/58* (2020.01)
 *G01R 31/52* (2020.01)
(52) U.S. Cl.
 CPC ......... *G01R 31/1272* (2013.01); *G01R 31/58* (2020.01); *G01R 31/52* (2020.01)
(58) Field of Classification Search
 CPC ..... G01R 31/1272; G01R 31/58; G01R 31/52
 See application file for complete search history.

(56) References Cited

U.S. PATENT DOCUMENTS

| 5,107,447 A | * | 4/1992 | Ozawa | G01R 15/142 |
| | | | | 324/544 |
| 6,930,610 B2 | * | 8/2005 | Gao | G01R 31/008 |
| | | | | 340/657 |

(Continued)

FOREIGN PATENT DOCUMENTS

| DE | 102018102959 A1 | 8/2019 |
| EP | 1439396 A2 | 7/2004 |
| EP | 2204660 A1 | 7/2010 |

OTHER PUBLICATIONS

M.Breunig et al.; LOF: Identifying Density-Based Local Outliers, Proceedings of the 2000 ACM SIGMOD international conference on Management of data, pp. 93-104; doi: 10.1145/342009.335388.

(Continued)

*Primary Examiner* — Dominic E Hawkins
(74) *Attorney, Agent, or Firm* — Henry M. Feiereisen LLC

(57) ABSTRACT

A method for evaluating partial discharge signals. Partial discharge signals are captured, at only one point or at a plurality of points, near insulation of the electrical outer conductors of a multi-phase alternating current. The multi-phase alternating current, flowing in respective outer conductors, has fixed phase shifts relative to each other. Partial discharge signals are superposed on each other. At least one characteristic variable of the partial discharge signals is defined. Each partial discharge signal is assigned a phase position. A characteristic variable value of each characteristic variable is determined. Each partial discharge signal is assigned a number tuple from each characteristic variable value of the partial discharge signal and from the phase position. Clusters of the partial discharge signals in a multidimensional space with points formed by the number tuples are determined. A partial discharge activity is deter- (Continued)

mined for each outer conductor from the determined clusters.

27 Claims, 4 Drawing Sheets

(56) References Cited

U.S. PATENT DOCUMENTS

| | | | | |
|---|---|---|---|---|
| 8,760,171 | B2* | 6/2014 | Steineke | G01R 31/1272 |
| | | | | 324/555 |
| 2004/0204873 | A1 | 10/2004 | Freisleben et al. | |
| 2006/0038573 | A1* | 2/2006 | Sarkozi | G01R 31/1272 |
| | | | | 324/536 |
| 2011/0291666 | A1* | 12/2011 | Steineke | G01R 31/1272 |
| | | | | 324/551 |
| 2017/0192048 | A1* | 7/2017 | Sako | G01R 31/1272 |
| 2019/0250204 | A1* | 8/2019 | Geiss | G01R 31/1272 |
| 2020/0096628 | A1* | 3/2020 | Tanaka | G01S 7/411 |

OTHER PUBLICATIONS

Borghetto J et al: "Partial Discharge Inference by an Advanced System. Analysis of Online Measurements Performed on Hydrogenerator", IEEE Transactions on Energy Conversion, IEEE Service Center, Piscataway, NJ, US, vol. 19, No. 2, pp. 333-339. XP011113368, ISSN: 0885-8969, DOI: 10.1109/TEC.2004.827473; Abstragt; Figures 2,3,5-9; Sections II and III; 2004.

PCT International Examination Report and Written Opinion of International Examination Authority mailed Oct. 28, 2020 corresponding to PCT International Application No. PCT/EP2020/072943 filed Aug. 17, 2020.

* cited by examiner

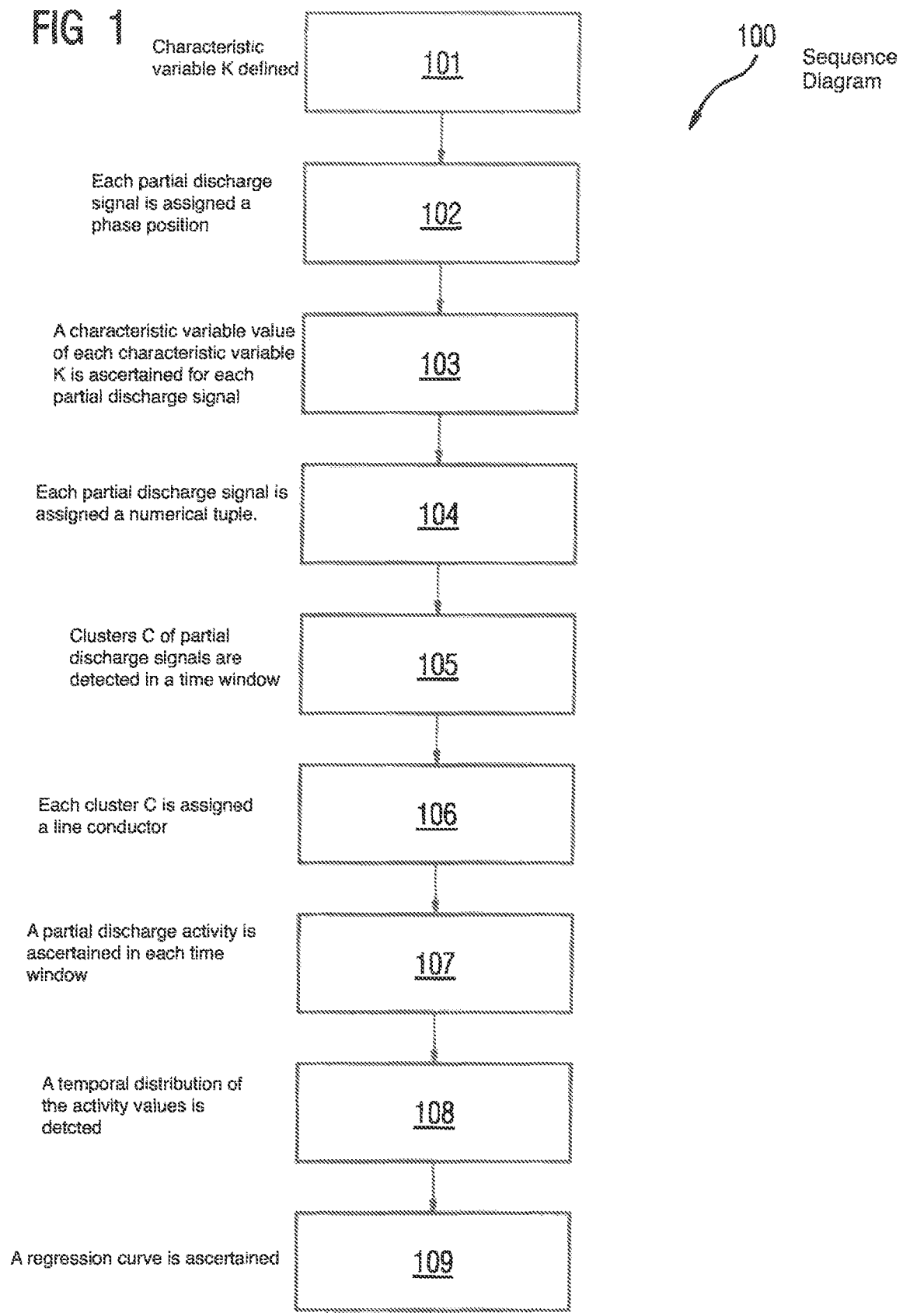

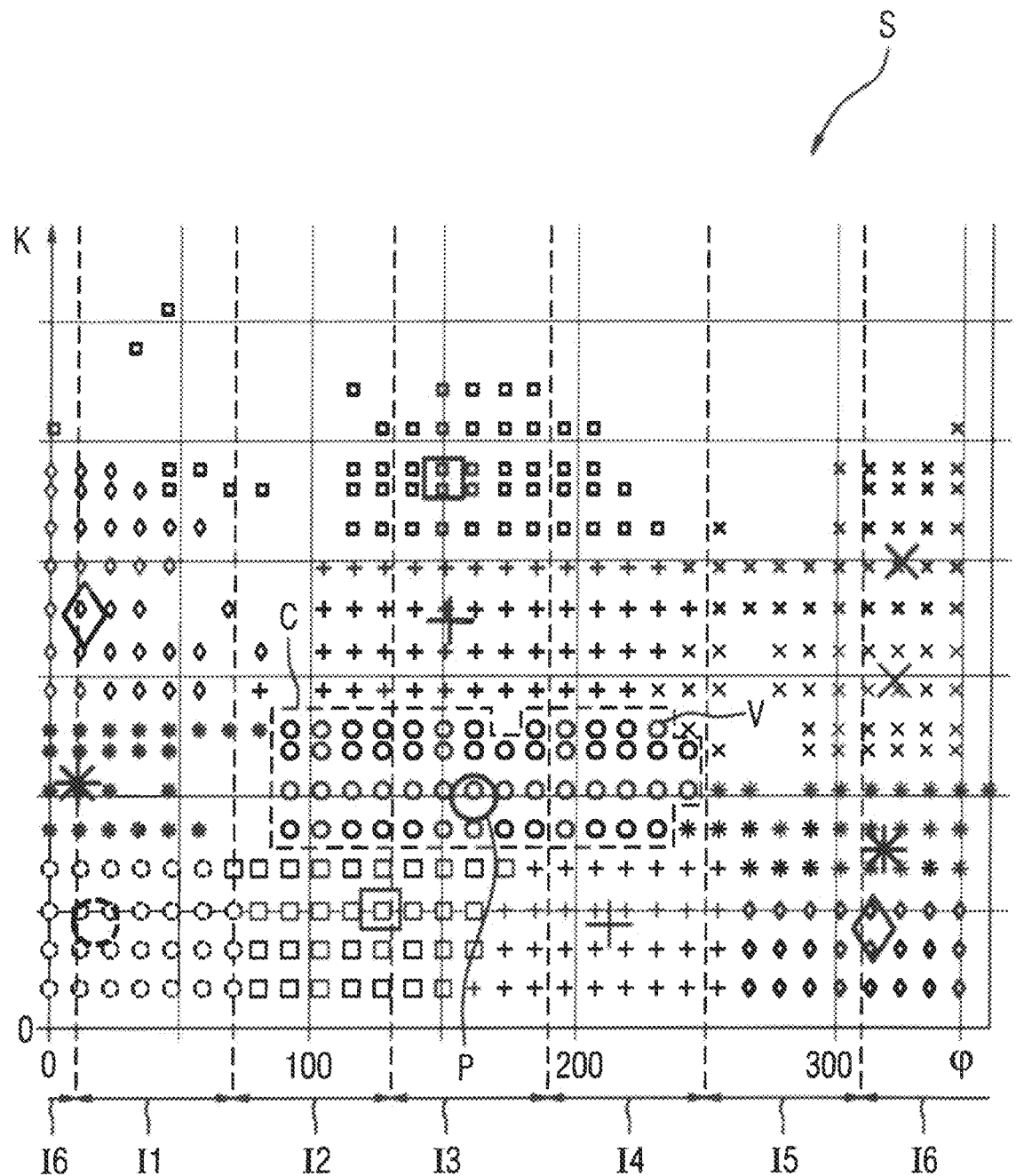

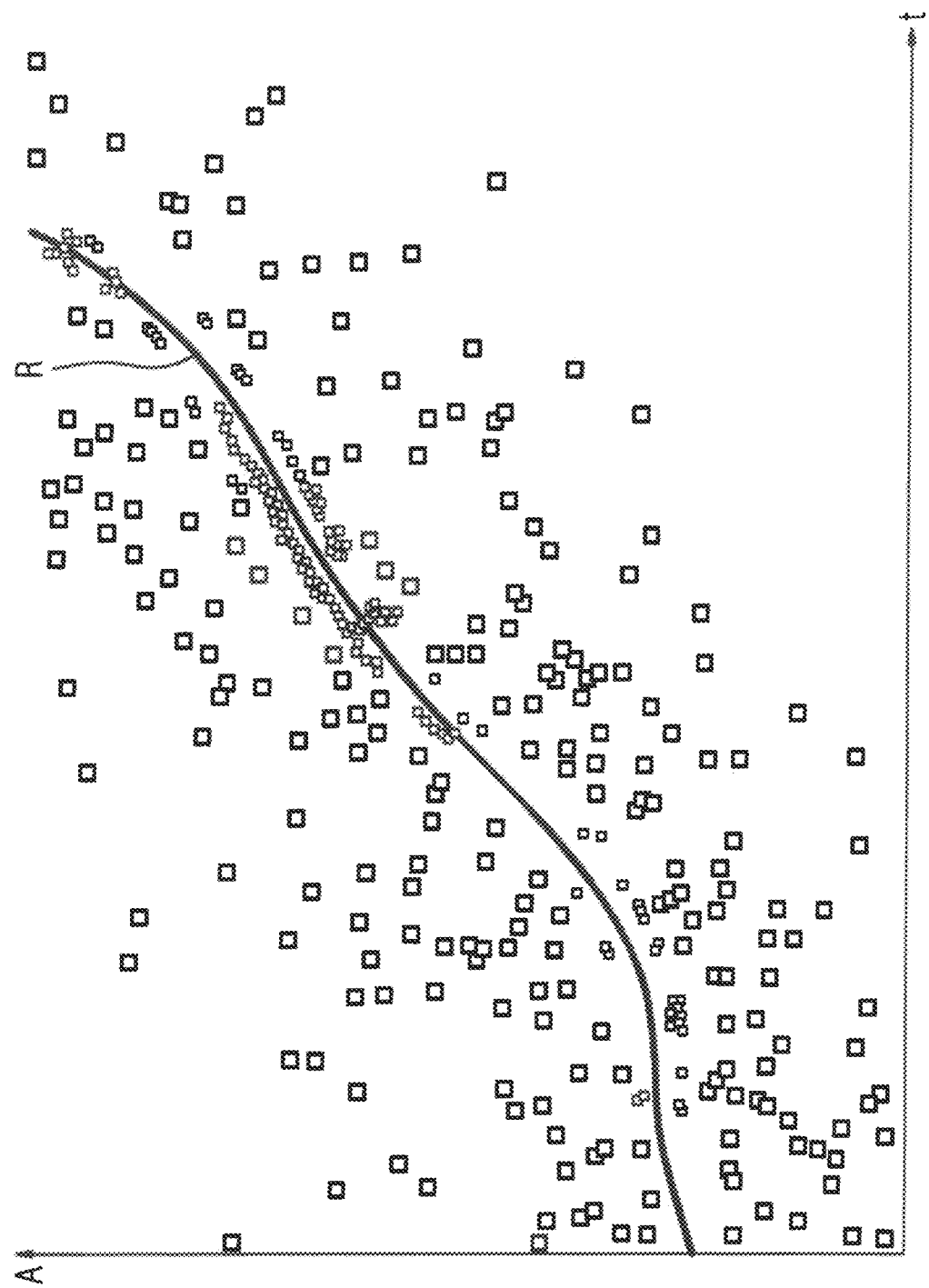

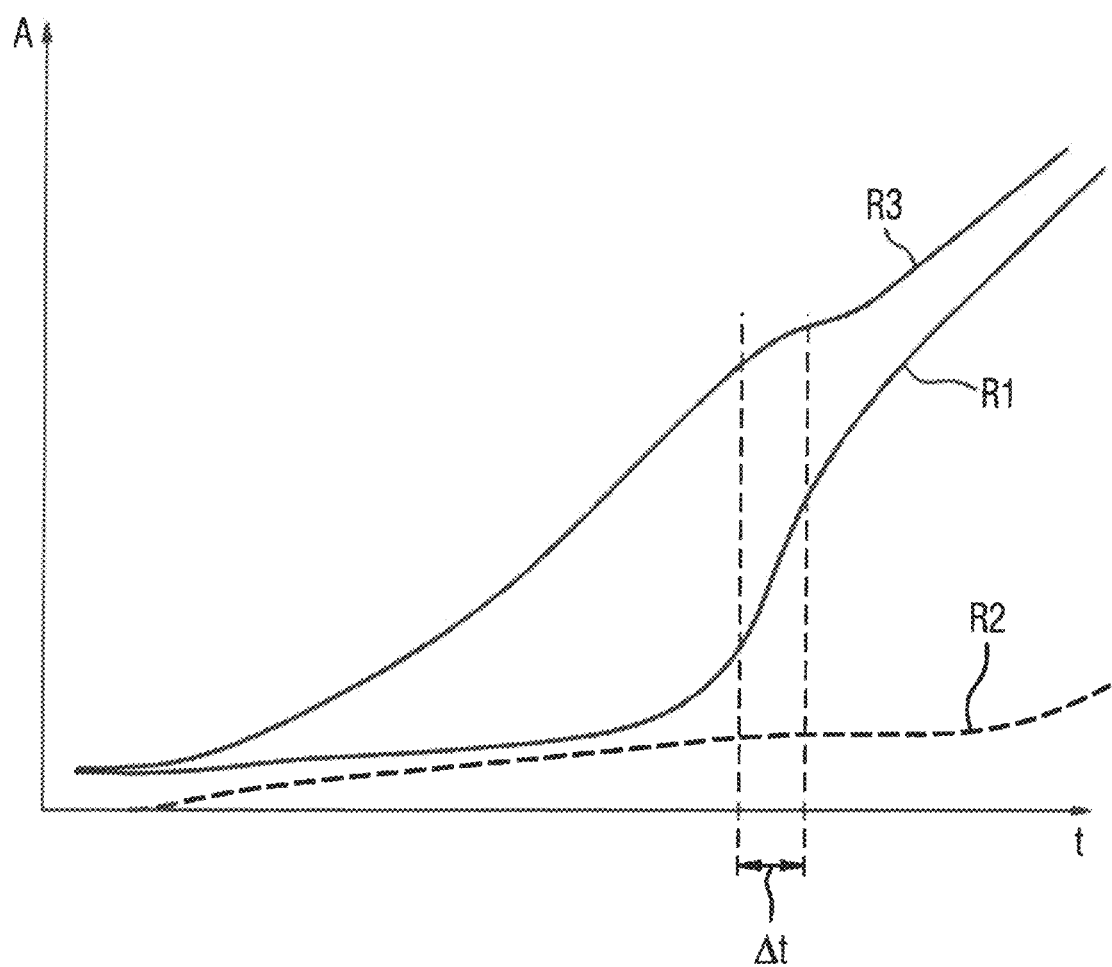

EVALUATION OF PARTIAL DISCHARGE SIGNALS

CROSS-REFERENCES TO RELATED APPLICATIONS

This application is the U.S. National Stage of International Application No. PCT/EP2020/072943 filed Aug. 17, 2020, which designated the United States and has been published as International Publication No. WO 2021/052691 A1 and which claims the priority of European Patent Application, Ser. No. 19/198,066.3, filed Sep. 18, 2019, pursuant to 35 U.S.C. 119 (a)-(d).

BACKGROUND OF THE INVENTION

The invention relates to the evaluation of partial discharge signals that are detected in the vicinity of an insulation of the electrical line conductor of a multiphase alternating current at only one location or are detected at multiple locations and overlaid on one another. In other words, the invention relates to a "single-channel" evaluation of partial discharge signals that are not detected and evaluated separately for the individual line conductors of the multiphase alternating current.

Partial discharges are local electrical discharges, which are for example caused in local inhomogeneities of the insulation material, for example in small air pockets, within the insulation of an electrical conductor due to strong inhomogeneities of an electrical field. Partial discharges may damage an insulation locally and over the long term may lead to the failure of the insulation. For this reason, electric machines in particular are examined for partial discharges on a regular basis. Partial discharges cause brief electromagnetic pulses with a typical pulse duration of less than 1 µs and frequency components far into the UHF frequency range. Usually searching takes place for partial discharge signals in frequency ranges between approximately 100 kHz and 10 MHz, in which partial discharge pulses are generally strongest.

A line conductor is an electrical conductor which in conventional operation is under electrical voltage and may contribute to the transferring or distribution of electrical energy, but is not a neutral conductor (central conductor).

There are a large number of measurement methods, some of which are standardized according to DIN EN 60270 for example, for the detection of partial discharges. On electric machines, it is almost exclusively offline measurements that are performed, in which the regular operation of an electric machine is interrupted and high costs are incurred, for example due to the interruptions to operation and the costs for the measurement devices. Such measurements can therefore only be performed occasionally.

Online measurements during the regular operation of an electric machine enable a continuous monitoring of the machine and in particular the identification of trends relating to partial discharge activities on the machine and a correlation of the partial discharge activities with various environmental influences such as temperature, air humidity and atmospheric pressure. The information gained therefrom may enable a reliable prediction that predicts the period of time in which a machine affected by partial discharges can continue to be operated in a reliable manner. Partial discharge signals detected by measurements are typically plotted and evaluated as partial discharge rates in the form of partial discharge histograms, in a synchronous manner in network phase for intervals of their respective energy contents.

In the case of a multiphase alternating current formed of multiple alternating currents, the partial discharges that are generated by the various alternating currents are overlaid over time. For this reason, partial discharge signals are generally detected and evaluated separately for each of these alternating currents. If, for cost-saving reasons, someone wishes to use only one partial discharge measurement unit or only one evaluation unit, i.e. to detect partial discharge signals at only one location or to evaluate partial discharge signals that were detected at multiple locations but overlaid on one another, then the problem arises that it is not possible to make any statements referring to the individual alternating currents with the conventional evaluation of partial discharge signals.

The object underlying the invention is to disclose a method for the improved evaluation of partial discharge signals that are detected in the vicinity of an insulation of the electrical line conductor of a multiphase alternating current at only one location or are detected at multiple locations and overlaid on one another.

SUMMARY OF THE INVENTION

The object is achieved according to the invention by a method as set forth hereinafter.

Advantageous embodiments of the invention are the subject matter of the dependent claims.

In the method according to the invention, partial discharge signals are evaluated which, in the vicinity of an insulation of the electrical line conductor of a multiphase alternating current, of which the alternating currents flowing in one line conductor in each case have fixed phase shifts in relation to one another, are detected at only one location or are detected at multiple locations and overlaid on one another. To this end, at least one characteristic variable is defined, on the basis of which partial discharge signals can be compared with one another. Each partial discharge signal is assigned a phase position of the alternating currents at the point in time of the detection of the partial discharge signal. A characteristic variable value of each characteristic variable is ascertained for each partial discharge signal. Each partial discharge signal is assigned a numerical tuple that is formed of each characteristic variable value of the partial discharge signal and the phase position assigned to the partial discharge signal. Clusters of the partial discharge signals are then ascertained in a multidimensional space with points formed by the numerical tuples, and a partial discharge activity is ascertained from the ascertained clusters for each line conductor.

In one embodiment, a partial discharge signal is extracted via a connection of at least one winding temperature sensor. The extraction of one or a large number of partial discharge signals, via a winding temperature sensor or via a large number of winding temperature sensors, results in a partial discharge detection method that measures the activity, i.e. partial discharges, in all phases in an overlaid manner. In order to separate the activity of the individual phases from this overlay, the duster, i.e. a cluster method, is used. This is helpful in order to be able to track the activity of individual phases and thus to identify changes in a phase at an early stage, which would only be identifiable in the overall activity at a later point.

The method according to the invention therefore provides the evaluation of partial discharge signals in a multidimensional space, the coordinates of which are at least one characteristic variable of the partial discharge signals and the phase position of the alternating currents. In this space, each partial discharge signal is represented by a point that is determined by the at least one characteristic variable of the partial discharge signal and the phase position at the point in time of the detection of the partial discharge signal. The points representing the partial discharge signals are merged to form various clusters using a cluster analysis, in order to assign the partial discharge signals to the various line conductors or to ascertain a partial discharge activity for each line conductor. The method according to the invention therefore enables a phase-dependent or line conductor-dependent evaluation of the partial discharge signals with only one measurement unit instead of with a separate measurement unit for each line conductor, and can therefore be realized in a cost-effective manner. The method according to the invention additionally makes it possible to evaluate partial discharge signals online, for example during regular operation of an electric machine conducting the multiphase alternating current, as the cluster analysis does not require any specific operating conditions.

In one embodiment of the invention, a pulse duration, pulse height, electric charge, energy and/or repetition rate of a partial discharge signal is defined as characteristic variable. For example, the pulse duration forms a first characteristic variable, the pulse height forms a second characteristic variable, etc.

In a further embodiment of the invention, the clusters are ascertained using a partitioning cluster method, a hierarchical cluster method, a density-based cluster method and/or using neural network methods. For example, a k-means algorithm, mean shift, Gaussian mixture and/or DBSCAN (density-based spatial clustering of applications with noise) may be used for the clustering.

In a further embodiment of the invention, a cluster centroid is determined for each cluster and the cluster is assigned to a line conductor that is determined from the phase position of the cluster centroid. For example, each phase position is assigned a line conductor and a cluster is assigned to the line conductor that is assigned to the phase position of the cluster centroid of the cluster. In particular, it may be provided that each line conductor is assigned to at least one phase angle interval of phase angles that characterize the phase positions. This embodiment of the invention uses the fact that partial discharges on a line conductor generally accumulate at certain phase angle intervals of the alternating current flowing in the line conductor, for example in phase angle intervals in which the alternating current or the corresponding alternating voltage has a relatively strong gradient. Since the alternating currents of the individual line conductors have fixed phase shifts in relation to one another, for this reason it is possible for phase angle intervals of phase angles that characterize the phase positions of the alternating currents to each be assigned to one of the line conductors at which an increased probability of partial discharges is present in the respective phase angle interval.

In a further embodiment of the invention, to ascertain the partial discharge activity of a line conductor, at least one activity variable is defined for partial discharge signals that are detected in a predefined time window and assigned to the line conductor. A number of partial discharge signals, which are detected in the time window and assigned to the line conductor, are defined as an activity variable, for example. As an alternative or in addition, an activity variable is formed from the characteristic variable values of the partial discharge signals which are detected in the time window and assigned to the line conductor. This enables a quantitative assessment and evaluation of the partial discharge activity on any line conductor.

In a development of the aforementioned embodiment of the invention, a temporal distribution of the activity values of at least one activity variable of each line conductor is detected and evaluated. In this context, it may be provided that for each temporal distribution of activity values an anomaly detection is performed, with which anomalous activity values are ascertained, and anomalous activity values are removed from the respective distribution of the activity values. Furthermore, it may be provided that for at least one activity variable and each line conductor, a regression curve for a progression of the activity variable as a function of time is ascertained from the temporal distribution of the activity values. In addition, it may be provided that a first derivation of each regression curve is ascertained with respect to time. Through such evaluations of the temporal distributions of activity values of the individual line conductors, it is advantageously possible to identify trends of the partial discharge activities on any line conductor and deduce predictions of the future development of said partial discharge activities. Furthermore, for example, warning and/or alarm signals can be generated if a regression curve exceeds a predefined threshold value or the derivation of a regression curve exceeds a predefined threshold value.

An evaluation unit according to the invention for the evaluation of partial discharge signals according to the method according to the invention is configured to assign each partial discharge signal the phase position of the alternating currents at the point in time of the detection of the partial discharge signal, to ascertain the characteristic variable value of each characteristic variable for each partial discharge signal, to assign each partial discharge signal the numerical tuple that is formed of each characteristic variable value of the partial discharge signal and the phase position assigned to the partial discharge signal, to ascertain the clusters of the partial discharge signals in multidimensional space with points formed by the numerical tuples, and to ascertain the partial discharge activity from the ascertained clusters for each line conductor.

In particular, the evaluation unit may be configured to carry out a computer program according to the invention. A computer program according to the invention comprises commands which, when the computer program is executed by an evaluation unit, prompt it to carry out the method according to the invention.

As a result, the method according to the invention may be realized with the aforementioned advantages, in particular in a computer-implemented manner.

As an alternative, the method may be carried out or partially carried out in at least one so-called "edge device" or in an application in a computer cloud.

BRIEF DESCRIPTION OF THE DRAWING

The above-described properties, features and advantages of this invention and the manner in which these are achieved will become more clearly and easily intelligible in connection with the following description of exemplary embodiments, which are explained in further detail with reference to the drawings, in which:

FIG. 1 shows a sequence diagram of an exemplary embodiment of a method according to the invention for the evaluation of partial discharge signals, FIG. 2 shows clusters of partial discharge signals and cluster centroids, FIG. 3 shows a temporal distribution of activity values of an activity variable for a partial discharge activity and a regression curve for a temporal progression of the activity variable, FIG. 4 shows regression curves for temporal progressions of an activity variable for the line conductors of a three-phase alternating current.

DETAILED DESCRIPTION OF PREFERRED EMBODIMENTS

Parts which correspond to one another are provided with the same reference characters in the figures.

FIG. 1 shows a sequence diagram 100 of an exemplary embodiment of a method according to the invention with method steps 101 to 109 for the evaluation of partial discharge signals which, in the vicinity of an insulation of the electrical line conductor of a multiphase alternating current, of which the alternating currents flowing in one line conductor in each case have fixed phase shifts in relation to one another, are detected at only one location or are detected at multiple locations and overlaid on one another. The partial discharge signals are detected using an antenna, for example, and filtered using a frequency filter, of which the passband has typical frequencies for partial discharge signals. Any other sensor may also be used to detect the partial discharge signals, however, for example a capacitive sensor apparatus with at least one sensor capacitor or an inductive coupling apparatus with at least one sensor coil. This is irrelevant to the invention.

In a first method step 101, at least one characteristic variable K is defined, on the basis of which partial discharge signals can be compared with one another. A characteristic variable of this kind may be a pulse duration, pulse height, electric charge, energy or repetition rate of a partial discharge signal, for example.

In a second method step 102, each partial discharge signal is assigned a phase position of the alternating currents at the point in time of the detection of the partial discharge signal. The phase position is defined by a phase angle φ of one of the alternating currents.

In a third method step 103, a characteristic variable value of each characteristic variable K is ascertained for each partial discharge signal.

In a fourth method step 104, each partial discharge signal is assigned a numerical tuple that is formed of each characteristic variable value of the partial discharge signal and the phase position assigned to the partial discharge signal. If the characteristic variables K are a pulse duration and pulse height, for example, then the entries of the numerical tuple assigned to a partial discharge signal are the characteristic variable value of the pulse duration, the characteristic variable value of the pulse height and the phase position assigned to the partial discharge signal.

In a fifth method step 105, for a predefined time window in each case, clusters C of the partial discharge signals detected in this time window are ascertained in a multidimensional space S with points V formed by the numerical tuples. The dusters C are ascertained, for example, using a partitioning cluster method (based on a k-means algorithm for example), a hierarchical duster method, a density-based duster method (DBSCAN for example) and/or using neural network methods.

In a sixth method step 106, each cluster C is assigned a line conductor. To this end, each line conductor is assigned at least one phase angle interval I1 to I6, for each cluster C a cluster centroid P is determined and a cluster-C is assigned to the line conductor that is assigned to the phase position of the cluster centroid P of the duster C (i.e. the value of the coordinate φ of the cluster centroid P in space S).

FIG. 2 shows, by way of example, for a three-phase angle current with alternating currents that have been phase-shifted in relation to one another by 120°, clusters C that have been ascertained in a time window and the cluster centroids P thereof, wherein the points V associated with a cluster C are represented by the same symbols and symbols that are different from other clusters C. The phase angle intervals I1 and I4 are assigned to a first line conductor. The phase angle intervals I2 and I5 are assigned to a second line conductor. The phase angle intervals I3 and I6 are assigned to the third line conductor. Each phase angle interval I1 to I6 has a width of 60°. The phase angle intervals I1 and I3 each have three cluster centroids P. The phase angle intervals I2 and I4 each have one cluster centroid P. The phase angle interval I5 has no cluster centroid P. The phase angle interval I6 has four cluster centroids P. Thus, in the time window, the first line conductor is assigned a total of four cluster centroids P, the second line conductor is assigned one cluster centroid P, and the third line conductor is assigned seven cluster centroids P.

In a seventh method step 107, a partial discharge activity is ascertained in each time window from the ascertained clusters C for each line conductor. To this end, at least one activity variable A is defined for partial discharge signals that are detected in the respective time window and assigned to a line conductor. A number of partial discharge signals, which are detected in the time window and assigned to the line conductor, are defined as an activity variable A, for example. As an alternative or in addition, an activity variable A is formed from the characteristic variable values of the partial discharge signals which are detected in the time window and assigned to the line conductor. For example, the value of a characteristic variable K of the cluster centroid P is used as an activity variable A, and/or an activity variable A is formed of maxima, minima, standard deviations, ratios of maxima to average values and/or statistical moments of the characteristic variable values of the partial discharge signals associated with a cluster C.

In an eighth method step 108, a temporal distribution of the activity values of at least one activity variable A of each line conductor is detected, for example a distribution over multiple months. Furthermore, for each of these temporal distributions, an anomaly detection (also referred to as outlier detection) is performed, with which what are known as anomalous activity values are ascertained, and anomalous activity values are removed from the respective distribution of the activity values. For anomaly detection, a temporal distribution of the activity values is analyzed, for example using a density-based cluster method such as DBSCAN. An anomaly detection of this kind is known for example from M. M. Breunig et al., LOF: identifying density-based local outliers, Proceedings of the 2000 ACM SIGMOD international conference on Management of data, pp. 93-104, doi: 10.1145/342009.335388.

In a ninth method step 109, for at least one activity variable A and each line conductor, a regression curve R, R1 to R3 for a progression of the activity variable A as a function of time t is ascertained from the temporal distribution of the activity values, for example using known so-called support vector machine regression methods. Furthermore, it may be provided to ascertain a first derivation of each regression curve R, R1 to R3 with respect to time. On the basis of the regression curves R, R1 to R3 as well as possibly the first derivations thereof, the temporal development of the partial discharge activities of each line conductor is monitored. For example, a warning and/or alarm signal is generated automatically if a regression curve R, R1 to R3 exceeds a predefined threshold value or the first derivation of a regression curve R, R1 to R3 exceeds a predefined threshold value.

The method described on the basis of method steps 101 to 109 may be expanded, for example, in that before the ascertaining of the clusters C in the fourth method step 104 an anomaly detection is performed in the multidimensional space S, in order to eliminate anomalous partial discharge signals.

FIG. 3 shows, by way of example, a temporal distribution of activity values of an activity variable A for a line conductor and a regression curve R for the progression of the activity variable A as a function of time t. Anomalous activity values lie further away from the regression curve R and are represented with a different symbol than the other activity values A.

By way of example, FIG. 4 shows regression curves R1 to R3 for temporal progressions of an activity variable A for the three line conductors of a three-phase alternating current. The regression curve R1 of a first line conductor runs above the regression curve R2 of a second line conductor and below the regression curve R3 of the third line conductor, but has high gradients in a time interval Δt. From this it is concluded, for example, that the highest partial discharge activity occurs on the third line conductor, the lowest discharge activity occurs on the second line conductor and the partial discharge activity on the first line conductor increases very quickly during the time interval Δt.

The method steps 101 to 109 are performed by an evaluation unit for the evaluation of partial discharge signals, for example, on which a computer program is executed, which comprises commands which, when the computer program is executed by the evaluation unit, prompt it to carry out the method steps 101 to 109. In particular, the evaluation unit may have at least one so-called neuromorphic integrated circuit. As an alternative, the method is carried out or partially carried out in at least one so-called "edge device" or in an application in a computer cloud.

Although the invention has been illustrated and described in detail on the basis of preferred exemplary embodiments, the invention is not restricted by the examples given and other variations can be derived therefrom by a person skilled in the art without departing from the protective scope of the invention.

The invention claimed is:

1. A method for evaluating partial discharge signals in a vicinity of an insulation of an electrical line conductor of a multiphase alternating current with alternating currents flowing in line conductors, said alternating currents having fixed phase shifts in relation to one another, said method comprising:
   detecting partial discharge signals at one location or detecting partial discharge signals overlaid on one another at multiple locations;
   defining at least one characteristic variable;
   comparing partial discharge signals with one another based on the at least one characteristic variable;
   assigning a phase position of the alternating currents at a detection time of the partial discharge signal to each partial discharge signal;
   ascertaining a characteristic variable value of each characteristic variable for each partial discharge signal;
   assigning a numerical tuple to each partial discharge signal, said numerical tuple formed of each characteristic variable value of the partial discharge signal and the phase position assigned to the partial discharge signal;
   ascertaining clusters of the partial discharge signals in a multidimensional space with points formed by the numerical tuples; and
   ascertaining a partial discharge activity from the ascertained clusters for each line conductor;
   wherein a pulse duration, pulse height, electric charge, energy and/or repetition rate of a partial discharge signal is defined as the characteristic variable, further comprising determining a cluster centroid for each cluster and assigning the cluster to a line conductor that is determined from the phase position of the cluster centroid, and through evaluations of temporal distributions of activity values of the individual line conductors, identifying trends of the partial discharge activities on each line conductor.

2. The method of claim 1, further comprising deducing predictions of future development of said partial discharge activities.

3. The method of claim 1, wherein the clusters are ascertained using a partitioning cluster method, a hierarchical cluster method, a density-based cluster method and/or using neural network methods.

4. The method of claim 1, further comprising assigning each phase position a line conductor and assigning a cluster to the line conductor that is assigned to the phase position of the cluster centroid of the cluster.

5. The method of claim 4, further comprising assigning each line conductor to at least one phase angle interval of phase angles that characterize the phase positions.

6. The method of claim 1, further comprising defining at least one activity variable for partial discharge signals that are detected in a predefined time window and assigned to the line conductor to ascertain the partial discharge activity of a line conductor.

7. The method of claim 6, further comprising defining the activity variable a number of partial discharge signals, which are detected in the time window and assigned to the line conductor, as the activity variable.

8. The method of claim 6, further comprising forming the activity variable from the characteristic variable values of the partial discharge signals which are detected in the time window and assigned to the line conductor.

9. The method of claim 6, further comprising detecting and evaluating a temporal distribution of the activity values of at least one activity variable of each line conductor.

10. The method of claim 9, further comprising performing an anomaly detection for each temporal distribution of activity values, ascertaining anomalous activity values, and removing anomalous activity values from the respective distribution of the activity values.

11. The method of claim 9, further comprising ascertaining a regression curve for at least one activity variable and each line conductor for a progression of the activity variable as a function of time from the temporal distribution of the activity values.

12. The method of claim 11, further comprising ascertaining a first derivation of each regression curve with respect to time.

13. An evaluation unit for evaluating partial discharge signals in a vicinity of an insulation of an electrical line conductor of a multiphase alternating current with alternating currents flowing in line conductors, said alternating currents having fixed phase shifts in relation to one another, said evaluation unit configured to:

detect partial discharge signals at one location or detecting partial discharge signals overlaid on one another at multiple locations;

define at least one characteristic variable;

compare partial discharge with one another based on the at least one characteristic variable;

assign each partial discharge signal a phase position of the alternating currents at a point in time of a detection of the partial discharge signal, ascertain a characteristic variable value of each characteristic variable for each partial discharge signal, assign each partial discharge signal a numerical tuple that is formed of each characteristic variable value of the partial discharge signal and the phase position assigned to the partial discharge signal, ascertain clusters of the partial discharge signals in a multidimensional space with points formed by the numerical tuples, and ascertain partial discharge activity from the ascertained clusters for each line conductor, wherein a pulse duration, pulse height electric charge, energy and/or repetition rate of a partial discharge signal is defined as the characteristic variable, and the evaluation unit is configured to determine a cluster centroid for each cluster and assign the cluster to a line conductor that is determined from the phase position of the cluster centroid, and through evaluations of temporal distributions of activity values of the individual line conductors, identify trends of the partial discharge activities on each line conductor.

14. The evaluation unit of claim 13, wherein the evaluation unit is further configured to define at least one activity variable for partial discharge signals that are detected in a predefined time window and assigned to the line conductor to ascertain the partial discharge activity of a line conductor and to detect and evaluate a temporal distribution of the activity values of at least one activity variable of each line conductor.

15. The evaluation unit of claim 14, wherein the evaluation unit is further configured to perform an anomaly detection for each temporal distribution of activity values, ascertaining anomalous activity values, and removing anomalous activity values from the respective distribution of the activity values.

16. The evaluation unit of claim 14, wherein the evaluation unit is further configured to ascertain a regression curve for at least one activity variable and each line conductor for a progression of the activity variable as a function of time from the temporal distribution of the activity values.

17. The evaluation unit of claim 16, wherein the evaluation unit is further configured to ascertain a first derivation of each regression curve with respect to time.

18. The evaluation unit of claim 13, wherein the evaluation unit is configured to deduce predictions of future development of said partial discharge activities.

19. A computer program product, comprising a computer program embodied in a non-transitory computer readable storage medium, wherein the computer program, when loaded into an evaluation unit and executed by the evaluation unit, causes the evaluation unit to carry out the steps of:

detecting partial discharge signals at one location or detecting partial discharge signals overlaid on one another at multiple locations;

defining at least one characteristic variable;

comparing partial discharge signals with one another based on the at least one characteristic variable;

assigning a phase position of the alternating currents at a detection time of the partial discharge signal to each partial discharge signal;

ascertaining a characteristic variable value of each characteristic variable for each partial discharge signal;

assigning a numerical tuple to each partial discharge signal, said numerical tuple formed of each characteristic variable value of the partial discharge signal and the phase position assigned to the partial discharge signal;

ascertaining clusters of the partial discharge signals in a multidimensional space with points formed by the numerical tuples; and ascertaining a partial discharge activity from the ascertained clusters for each line conductor;

wherein a pulse duration, pulse height electric charge, energy and/or repetition rate of a partial discharge signal is defined as the characteristic variable, further comprising determining a cluster centroid for each cluster and assigning the cluster to a line conductor that is determined from the phase position of the cluster centroid, and through evaluations of temporal distributions of activity values of the individual line conductors, identifying trends of the partial discharge activities on each line conductor.

20. The computer program product of claim 19, wherein the computer program causes the evaluation unit to further define at least one activity variable for partial discharge signals that are detected in a predefined time window and assigned to the line conductor to ascertain the partial discharge activity of a line conductor and to detect and evaluate a temporal distribution of the activity values of at least one activity variable of each line conductor.

21. The computer program product of claim 20, wherein the computer program causes the evaluation unit to further perform an anomaly detection for each temporal distribution of activity values, ascertaining anomalous activity values, and removing anomalous activity values from the respective distribution of the activity values.

22. The computer program product of claim 20, wherein the computer program causes the evaluation unit to further ascertain a regression curve for at least one activity variable and each line conductor for a progression of the activity variable as a function of time from the temporal distribution of the activity values.

23. The computer program product of claim 22, wherein the computer program causes the evaluation unit to further ascertain a first derivation of each regression curve with respect to time.

24. The computer program product of claim 19, wherein the computer program causes the evaluation unit to further deduce predictions of future development of said partial discharge activities.

25. A method for evaluating partial discharge signals in a vicinity of an Insulation of an electrical line conductor of a multiphase alternating current with alternating currents flowing in line conductors, said alternating currents having fixed phase shifts in relation to one another, said method comprising:

detecting partial discharge signals at one location or detecting partial discharge signals overlaid on one another at multiple locations;

defining at least one characteristic variable;

comparing partial discharge signals with one another based on the at least one characteristic variable;

assigning a phase position of the alternating currents at a detection time of the partial discharge signal to each partial discharge signal;

ascertaining a characteristic variable value of each characteristic variable for each partial discharge signal;

assigning a numerical tuple to each partial discharge signal, said numerical tuple formed of each characteristic variable value of the partial discharge signal and the phase position assigned to the partial discharge signal;

ascertaining clusters of the partial discharge signals in a multidimensional space with points formed by the numerical tuples;

ascertaining a partial discharge activity from the ascertained clusters for each line conductor;

defining at least one activity variable for partial discharge signals that are detected in a predefined time window and assigned to the line conductor to ascertain the partial discharge activity of a line conductor; and detecting and evaluating a temporal distribution of the activity values of at least one activity variable of each line conductor.

26. An evaluation unit for evaluating partial discharge signals in a vicinity of an insulation of an electrical line conductor of a multiphase alternating current with alternating currents flowing in line conductors, said alternating currents having fixed phase shifts in relation to one another, said evaluation unit configured to:

assign each partial discharge signal a phase position of the alternating currents at a point in time of a detection of the partial discharge signal, ascertain a characteristic variable value of each characteristic variable for each partial discharge signal, assign each partial discharge signal a numerical tuple that is formed of each characteristic variable value of the partial discharge signal and the phase position assigned to the partial discharge signal, ascertain clusters of the partial discharge signals in a multidimensional space with points formed by the numerical tuples, and ascertain partial discharge activity from the ascertained clusters for each line conductor, wherein the evaluation unit is further configured to define at least one activity variable for partial discharge signals that are detected in a predefined time window and assigned to the line conductor to ascertain the partial discharge activity of a line conductor and to detect and evaluate a temporal distribution of the activity values of at least one activity variable of each line conductor.

27. A computer program product, comprising a computer program embodied in a non-transitory computer readable storage medium, wherein the computer program, when loaded into an evaluation unit and executed by the evaluation unit, causes the evaluation unit to carry out the steps of:

detecting partial discharge signals at one location or detecting partial discharge signals overlaid on one another at multiple locations;

defining at least one characteristic variable;

comparing partial discharge signals with one another based on the at least one characteristic variable;

assigning a phase position of the alternating currents at a detection time of the partial discharge signal to each partial discharge signal;

ascertaining a characteristic variable value of each characteristic variable for each partial discharge signal;

assigning a numerical tuple to each partial discharge signal, said numerical tuple formed of each characteristic variable value of the partial discharge signal and the phase position assigned to the partial discharge signal;

ascertaining clusters of the partial discharge signals in a multidimensional space with points formed by the numerical tuples; and ascertaining a partial discharge activity from the ascertained clusters for each line conductor, wherein the computer program causes the evaluation unit to further define at least one activity variable for partial discharge signals that are detected in a predefined time window and assigned to the line conductor to ascertain the partial discharge activity of a line conductor and to detect and evaluate a temporal distribution of the activity values of at least one activity variable of each line conductor.

* * * * *